INVENTOR

*FRANCESCO GIORGETTI*

BY *Young & Thompson*

ATTORNEYS

INVENTOR
FRANCESCO GIORGETTI
BY Young + Thompson
ATTORNEYS

1

3,426,288

COUPLING NETWORK FOR WIDE-BAND IF AMPLIFIERS

Francesco Giorgetti, Milan, Italy, assignor to Società Italiana Telecomunicazioni Siemens S.p.A., Milan, Italy Filed Feb. 7, 1967, Ser. No. 614,479
Claims priority, application Italy, Feb. 11, 1966, 14,388/66
U.S. Cl. 330—21 4 Claims
Int. Cl. H03f *1/42, 3/04*

ABSTRACT OF THE DISCLOSURE

A coupling between stages of a common base transistor IF amplifier employing a parallel resonant and series resonant circuit coupled by a transformer having a pair of windings wound on toroidal shaped ferrite, the windings being in bifilar relation. Inductance in the transformer primary circuit is minimized by a damping resistor.

The present invention relates to a coupling network for intermediate frequency amplifiers, in which the possibility of amplification through wide-bands of frequencies (i.e., the band-gain product) is limited by the inherent characteristic of the active element and not by the parasitic parameters of the elements composing the coupling networks.

The present art utilizes transistors as active elements. Since transistor characteristics vary in some degree with the temperature, it appears that a problem exists in designing IF amplifiers having no change in frequency response due to temperature variations. Because the variations of the elements of a filter particularly affect the end frequencies of the band considered, the present procedure of designing interstage filters is to extend the band width beyond the band required by the signal, so that the signal is always held inside a stable portion of the response curve. The required selectivity is subsequently obtained by means of a passive filter which does not involve problems of stability and which is placed after the amplifier. This filter must exhibit different characteristics, in accordance with the particular use of the amplifier. Extra wide-band amplifiers were designed in the prior art using interstage coupling networks of the low-pass type or of band-pass type. A low-pass network comprises a capacitor connected to ground followed by an inductor and by a resistor in series.

A transformer, whose windings are of the bifilar type, completes the circuit. With this arrangement it may be possible to realize a transformer which displays the largest frequency-band possible; particularly, its primary winding must have high impedance at the frequency band reguired with respect to the network parameters, and the transformer must provide the current gain of the stage.

This type of interstage circuit has material shortcomings, however, its pass-band starts from zero frequency and includes all the frequencies of the useful band. When higher frequencies are particularly involved, the band used by the signal becomes a very small fraction of the amplified band. For example, when it is desired to amplify a signal which covers a band of 20 mHz., centered on 70 mHz., a flat amplifier from zero to about 100 mHz. is required. This deficiency is obviously greater as the center band frequency of the signal is shifted to higher values (for example: if the signal to be amplified still comprises a 20 mHz. band, but it is centered on 100 mHz., a flat amplifier from zero to 130 mHz. is required).

A parallel-series type pass-band network, comprises two circuits, tuned to the same frequency or to two different frequencies inside the useful band, coupled by a transformer. The primary of the transformer comprises part of the parallel-resonant circuit and the leakage inductance, considered on the secondary winding, comprises part of the series-resonant circuit.

2

For reducing the leakage inductance which affects the band-gain product characteristic of the active element to the smallest value, the transformer is dimensioned as a transformer or autotransformer to obtain the highest coupling coefficient K.

To accomplish this, the two windings of the transformer are interleaved with each other on a hollow support body with thin walls, having the same coil diameter and the same pitch, which receives therein a magnetic material core, along the entire coil cross-section. Following this practice, there is obtained an adequate high value for K, but the advantages obtained are limited by the fact that the distributed capacitance, present between the transformer turns, must be considered in the equivalent circuit as a concentrated capacitance, which is added in parallel to the output capacity of the active element. This consequently determines a decrease of the band-gain product.

This type of filter presents two drawbacks; the first arises when, for calibration purposes, the inductance of the first resonant circuit is made variable and consequently, the turns ratio and the coupling coefficient are modified. The second arises when, to obtain high reduction of the inductance of the first resonant circuit (owing to the working frequency or to the high parasitic capacitance), the desired turns ratio becomes critical or had to obtain.

It is therefore an object of the invention to provide a network which overcomes the difficulties presented by the pass-band networks designed in accordance with the prior art, particularly in the frequancy range where it is difficult to realize the desired turns ratio with a coupling coefficient as high as possible.

Moreover, with the network of the invention, it is possible to obtain a higher band-gain product, using the same active element. This allows a responsive curve in the useful band (whatever it may be), which is more stable with temperature and provides a smaller variation of the transit-time (this facilitates the equalization of the group delay). Such a network is particularly adapted for use in the frequency range where, the pass-band networks are preferred (also following the known art) in place of the low-pass types.

Accordingly, another object of the present invention is to provide a coupling network in the form of a parallel-series pass-band filter, comprising two circuits tuned to the same frequency or to two different frequencies included in the useful band, coupled therebetween by means of a transformer. The network is taking advantage of the fact that the transformer, which can be designed following the known bifilar winding procedure, acts in the useful band as an ideal transformer and that the damping resistor of the secondary resonant circuit can be transferred to the primary of the transformer.

Various other features will appear from the following description, given as a nonlimitative example with reference to the attached drawings, in which.

Figure 1:
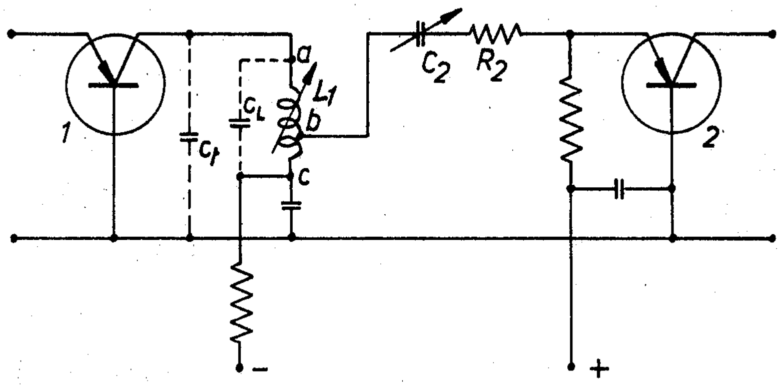
FIG. 1 (PRIOR ART)
FIG. 1 is a schematic view, showing a coupling network using a band-pass filter, following the prior art.

A well-known coupling network between two stages of a transistor amplifier of the pass-band filter type is shown in FIG. 1, where the condition of resonance of a first circuit is obtained with the inductor $L_1$, with the transistor output capacitance $C_1$ and with winding capacitance $C_L$ of $L_1$, the coupling being obtained through a tap on a point *b* of the inductor $L_1$. The condition of resonance of a second circuit is obtained with the global inductance comprising the leakage inductance of the transformer, the wiring inductance to transistor 2 and the input inductance of this transistor with the variable capacitor $C_2$ and damping resistor $R_2$.

Figure 2:
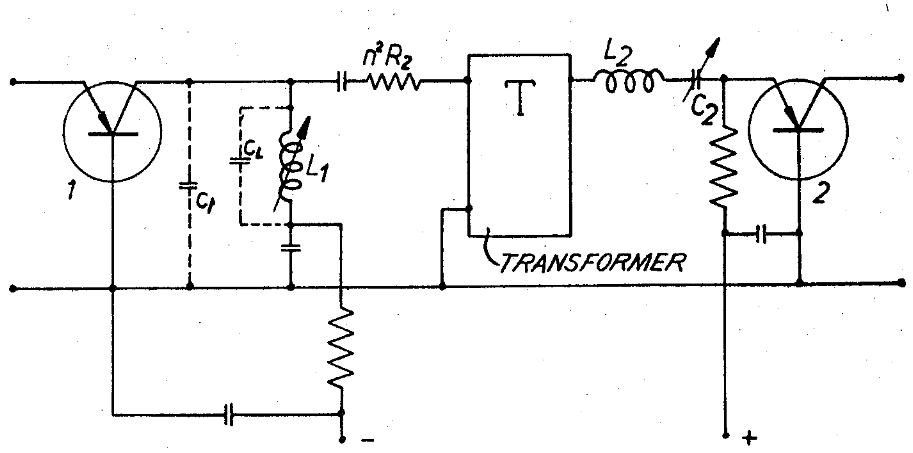
FIG. 2 is a similar view showing an example of an embodiment according to the invention.

FIG. 2 shows a coupling network, in accordance with the invention. The coupling autotransformer or transformer T (represented as an ideal transformer) is separated from the resonant circuits and presents a high impedance with respect to the other network elements at the frequency band covered by the signals. This autotransformer is made, for example, by winding a small number of turns on a toroidal core of ferrite, in accordance with the known art, which uses bifilar windings. The network consists of a first parallel resonant circuit comprising inductor $L_1$ and transistor output-capacitance $C_t$, together with the distributed capacitance $C_L$ of winding $L_1$; and of a second series-resonant circuit comprising inductor $L_2$ together with the leakage inductance of the transformer, the wiring inductance and the transistor input inductance, variable capacitor $C_2$ and a damping resistor, which, when being transferred to the primary of transformer T, is indicted by $n^2R_2$, where $n$ is the turns ratio between the primary and secondary of transformer T. The resistor is referred to the primary, whereas the leakage inductance, introduced by the wiring (inductance which cannot be reduced under a certain value), appears on the secondary divided by $n^2$, therefore lightly affecting the band-gain product which is the characteristic of the interstage network.

Employing of a high impedance transformer with ferrite core provides other advantages. Due to the high permeability of the ferrite, a smaller number of turns is necessary to obtain higher inductance and, consequently, the distributed capacitance across the transformer windings is held to tolerable limits. Moreover, with this arrangement, the current gain is kept independent of frequency, because it is provided by the transformer, the functions of which are not related to the functions of the elements composing a part of the parallel-resonant circuit.

Figure 3:
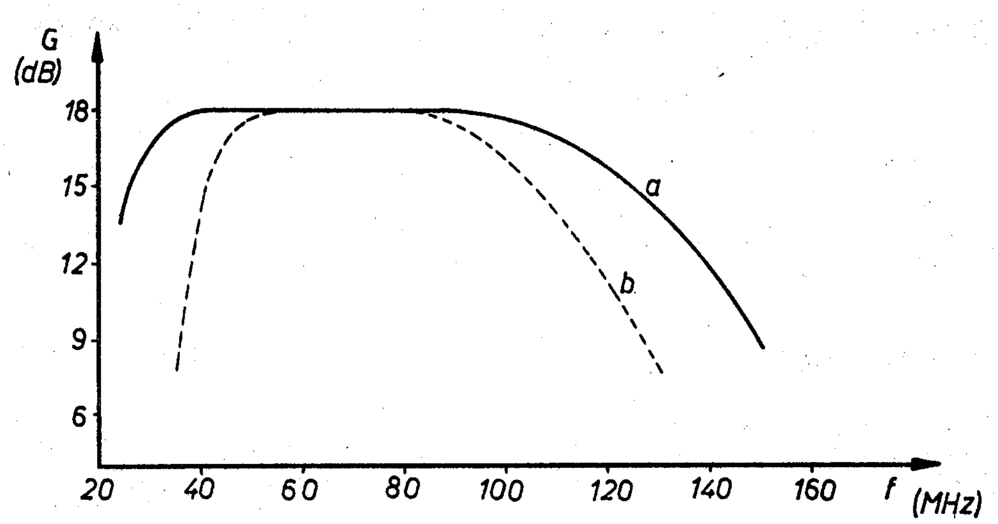
FIG. 3 is a chart representing, for comparison purpose, respectively: the gain curves in terms of frequency of a two stage amplifier, making use of the coupling network, according to the invention and of two stage amplifier following the prior art.

The curves *a* and *b* of FIG. 3 give the gain in terms of the frequency, respectively, for a two-stage amplifier, in accordance with the invention (*a*), and for a two-stage amplifier, following the known art (*b*).

From the comparison of the two curves, the amplifier, according to the invention, provides equal gain and a greater band width at 3 db (about 100 mHz. with respect to 65 mHz.).

Figure 4:
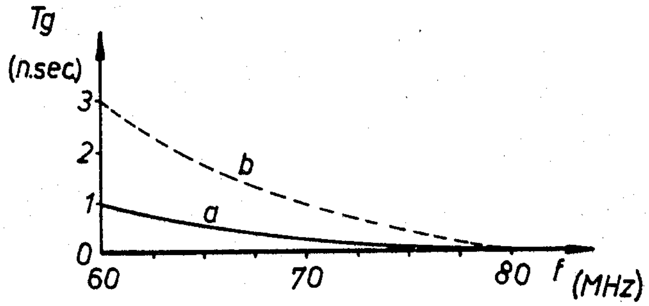
FIG. 4 is another chart representing, for comparison purpose, respectively: the curves of the group-delay, in terms of the frequency of both the amplifiers above mentioned.

The curves *a* and *b* of FIG. 4 give the variation of the group-delay $T_g$ in terms of the frequency, respectively for the two above mentioned amplifiers of FIG. 1 and FIG. 2. From the comparison of the curves of FIG. 4, it appears that, when it is required to have equalization of the group-delay, it is easier to obtain same with more temperature stability if the coupling network of the invention is used.

While we have shown and described the principles of our invention in connection with a specific embodiment, it is apparent that various changes and modifications may be made therein without departing from the general features of the invention and it is intended that all such changes and modifications be covered by the appended claims.

What is claimed is:

1. In a coupling network for a pair of amplifier stages which comprises, a band-pass filter having two tuned circuits, the first tuned circuit being of parallel resonance type and connected to the output of the first amplifier stage and the second tuned circuit being of series resonance type and connected to the input of the second amplifier stage, a transformer connected in parallel with the first resonant circuit and in series with said second resonant circuit, said transformer providing the current gain of the stage, said transformer having both coils thereof on a toroidal ferrite core, said coils being wound in bifilar relation.

2. A coupling circuit according to claim 1 wherein said first resonant circuit further includes a damping resistor to minimize inductive effects.

3. A coupling circuit according to claim 1 wherein said amplifier stages are transistor circuits in common base configuration.

4. A coupling circuit according to claim 2 wherein said amplifier stages are transistor circuits in common base configuration.

References Cited

UNITED STATES PATENTS 3,110,869 11/1963 Smith-Vaniz et al. ---- 330—21

ROY LAKE, *Primary Examiner.*

SIEGFRIED H. GRIMM, *Assistant Examiner.*

U.S. Cl. X.R.

330—167, 171; 333—78